(12) United States Patent
Mun et al.

(10) Patent No.: US 11,791,392 B2
(45) Date of Patent: Oct. 17, 2023

(54) EXTENDED-DRAIN METAL-OXIDE-SEMICONDUCTOR DEVICES WITH A NOTCHED GATE ELECTRODE

(71) Applicant: GLOBALFOUNDRIES Singapore Pte. Ltd., Singapore (SG)

(72) Inventors: Bong Woong Mun, Singapore (SG); Upinder Singh, Singapore (SG); Jeoung Mo Koo, Singapore (SG)

(73) Assignee: GlobalFoundries Singapore Pte. Ltd.

( * ) Notice: Subject to any disclaimer, the term of this patent is extended or adjusted under 35 U.S.C. 154(b) by 151 days.

(21) Appl. No.: 17/341,858

(22) Filed: Jun. 8, 2021

(65) Prior Publication Data
US 2022/0393009 A1    Dec. 8, 2022

(51) Int. Cl.
H01L 29/423    (2006.01)
H01L 29/40    (2006.01)
H01L 29/66    (2006.01)
H01L 29/78    (2006.01)

(52) U.S. Cl.
CPC ........ H01L 29/4238 (2013.01); H01L 29/401 (2013.01); H01L 29/42368 (2013.01); H01L 29/66681 (2013.01); H01L 29/7816 (2013.01)

(58) Field of Classification Search
CPC ............... H01L 29/4238; H01L 29/401; H01L 29/42368; H01L 29/66681; H01L 29/7816
See application file for complete search history.

(56) References Cited

U.S. PATENT DOCUMENTS

| 2008/0157203 A1 | 7/2008 | Shin |
| 2012/0098062 A1* | 4/2012 | Pendharkar ........... H01L 29/402 257/337 |
| 2016/0190269 A1 | 6/2016 | Brown et al. |
| 2017/0194489 A1* | 7/2017 | Park ...................... H01L 29/407 |

OTHER PUBLICATIONS

Bong Woong Mun et al., "Extended-Drain Metal-Oxide-Semiconductor Devices With a Multiple-Thickness Buffer Dielectric Layer" filed Sep. 14, 2020 as U.S. Appl. No. 17/019,836.

* cited by examiner

*Primary Examiner* — Mohammed R Alam
(74) *Attorney, Agent, or Firm* — Thompson Hine LLP; Francois Pagette (57) ABSTRACT

Structures for an extended-drain metal-oxide-semiconductor device and methods of forming a structure for an extended-drain metal-oxide-semiconductor device. The structure includes a substrate, a source region and a drain region in the substrate, a buffer dielectric layer positioned on the substrate adjacent to the drain region, and a gate electrode laterally positioned between the source region and the drain region. The gate electrode includes a portion that overlaps with the buffer dielectric layer, and the portion of the gate electrode includes notches.

20 Claims, 14 Drawing Sheets

EXTENDED-DRAIN METAL-OXIDE-SEMICONDUCTOR DEVICES WITH A NOTCHED GATE ELECTRODE

BACKGROUND

The invention relates generally to semiconductor devices and integrated circuit fabrication and, more specifically, to structures for an extended-drain metal-oxide-semiconductor device and methods of forming a structure for an extended-drain metal-oxide-semiconductor device.

High-voltage integrated circuits used, for example, in microwave/RF power amplifiers typically require specialized circuit technology capable of withstanding higher voltages. Extended-drain metal-oxide-semiconductor (EDMOS) devices, also known as laterally-diffused metal-oxide-semiconductor (LDMOS) devices, are designed to handle such higher voltages by incorporating additional transistor features, such as an extended drain, that promote the higher voltage handling capability. However, elevated drain voltages make an extended-drain metal-oxide-semiconductor device highly susceptible to damage caused by hot-carrier injection. The damage caused by hot-carrier injection may degrade the linear drain current. Consequently, the ability to use an extended-drain metal-oxide-semiconductor device in automotive applications, as well as other applications, may be restricted.

The performance of a field-effect transistor, such as an extended-drain metal-oxide-semiconductor device, may be evaluated using a figure of merit (FOM). The figure of merit may be given by the product of the gate charge (Qg) and the drain-source on-resistance (Ron). The gate charge is a measure of the amount of gate charge required to drive the gate-to-source voltage to turn a field-effect transistor "on" during operation and is indicative of switching performance. The on-resistance is a measure of the electrical resistance value between the drain and source of a field-effect transistor during operation and is indicative of power loss.

Measures may be taken to improve the figure of merit by reducing the gate charge through changes in the design parameters. However, this improvement may be offset by an increase in the breakdown voltage. In addition, the degree of improvement to the figure of merit may be offset if the changed design parameters cause the on-resistance to increase.

Improved structures for an extended-drain metal-oxide-semiconductor device and methods of forming an extended-drain metal-oxide-semiconductor device are needed.

SUMMARY

In an embodiment, a structure for an extended-drain metal-oxide-semiconductor device is provided. The structure includes a substrate, a source region and a drain region in the substrate, a buffer dielectric layer positioned on the substrate adjacent to the drain region, and a gate electrode laterally positioned between the source region and the drain region. The gate electrode includes a portion that overlaps with the buffer dielectric layer, and the portion of the gate electrode includes a plurality of notches.

In an embodiment, a method of forming a structure for an extended-drain metal-oxide-semiconductor device is provided. The method includes forming a source region and a drain region in a substrate, forming a buffer dielectric layer positioned on the substrate adjacent to the drain region, and forming a gate electrode laterally positioned between the source region and the drain region. The gate electrode includes a portion that overlaps with the buffer dielectric layer, and the portion of the gate electrode includes a plurality of notches.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals are used to indicate like features in the various views.

DETAILED DESCRIPTION

Figure 1:
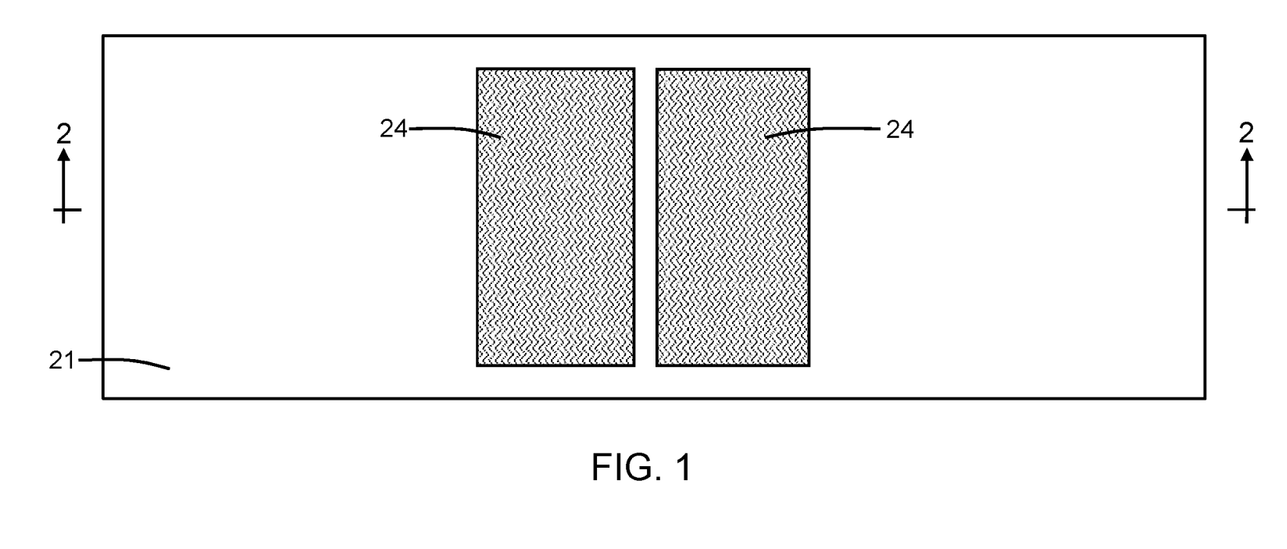
FIG. 1 is a top view of a structure at an initial fabrication stage in accordance with embodiments of the invention.
Figure 2:
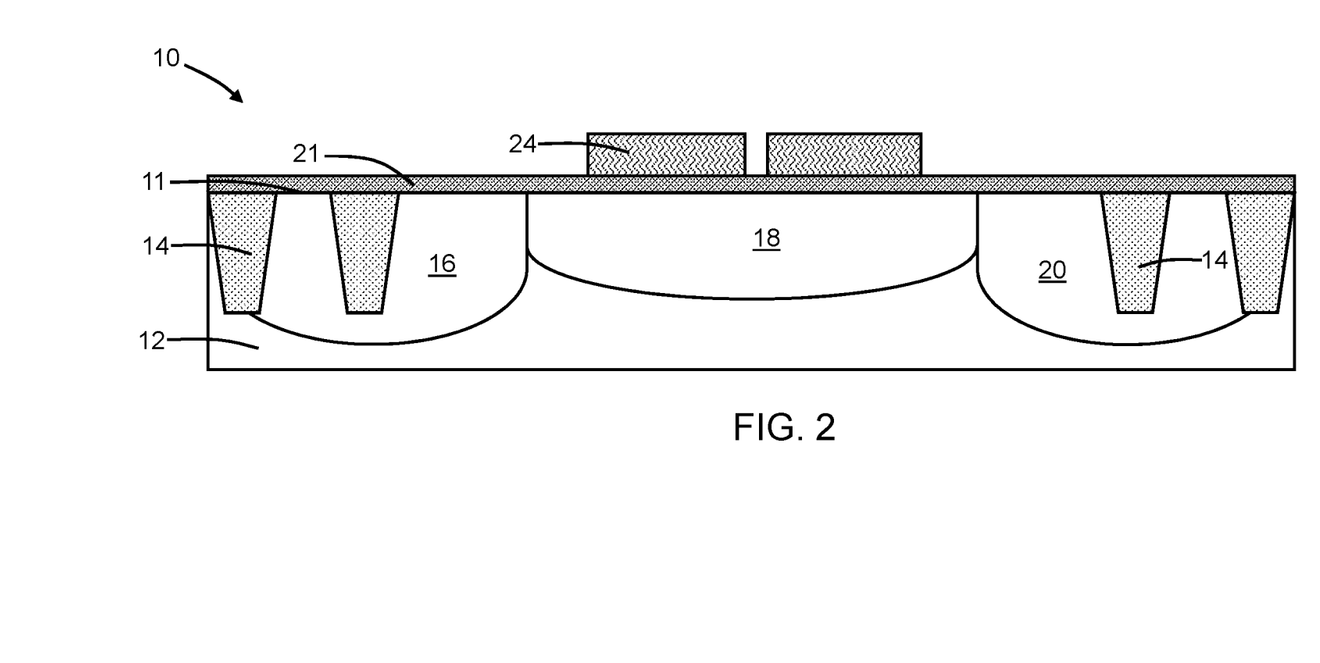
FIG. 2 is a cross-sectional view taken generally along line 2-2 in FIG. 1.

With reference to FIGS. 1, 2 and in accordance with embodiments of the invention, a structure 10 for an extended-drain metal-oxide-semiconductor device includes a substrate 12 and trench isolation regions 14 that are arranged in the substrate 12 to surround an active region. The substrate 12 may be comprised of a single-crystal semiconductor material, such as single-crystal silicon, and may be lightly doped to have p-type conductivity. The trench isolation regions 14 may be formed by defining shallow trenches in the substrate 12 with lithography and etching processes, depositing a dielectric material to fill the shallow trenches, and planarizing and/or recessing the deposited dielectric material. The dielectric material comprising the trench isolation regions 14 may be silicon dioxide and/or another electrical insulator deposited by chemical vapor deposition.

Wells 16, 18, 20 are formed in the active region of the substrate 12. The wells 16, 18, 20 intersect different portions of a top surface 11 of the substrate 12. The wells 18, 20 are comprised of semiconductor material of the substrate 12 that is doped to have a given conductivity type. The well 16 is comprised of semiconductor material of the substrate 12 that is doped to have a conductivity type of an opposite polarity from the conductivity type of the semiconductor material of the wells 18, 20. The well 16 may be formed by introducing a dopant by, for example, ion implantation with given implantation conditions into the substrate 12. The wells 18, 20 may be formed by introducing a different dopant of opposite conductivity type by, for example, ion implantation into the substrate 12. A patterned implantation mask may be formed to define a selected area on the top surface 11 that is exposed for each individual implantation. The implantation masks cover different areas on the top surface 11 in order to determine, at least in part, the location and horizontal dimensions of the wells 16, 18, 20. Each implantation mask may include a layer of a material, such as an organic photoresist, that is applied and patterned such that the different areas on the top surface 11 are covered and masked. Each implantation mask has a thickness and stopping power sufficient to block implantation of the masked areas.

The implantation conditions (e.g., ion species, dose, kinetic energy) may be selected to tune the electrical and physical characteristics of the well 16. A separate set of implantation conditions (e.g., ion species, dose, kinetic energy) may be selected to tune the electrical and physical characteristics of the wells 18, 20. In an embodiment in which the substrate 12 has p-type conductivity, the well 16 may contain semiconductor material doped with an n-type dopant (e.g., phosphorus and/or arsenic) to provide n-type conductivity, and the wells 18, 20 may contain semiconductor material doped with a p-type dopant (e.g., boron) to provide p-type conductivity.

A dielectric layer 21 is formed on the top surface 11 of the substrate 12. In an embodiment, the dielectric layer 21 may be comprised of silicon dioxide. In an embodiment, the dielectric layer 21 may be comprised of high-temperature silicon dioxide formed by thermal oxidation of the semiconductor material of the substrate 12.

An etch mask 24 may be formed by a lithography process on the dielectric layer 21 with sections at spaced-apart locations that are positioned over the well 18. The etch mask 24 may comprise an organic photoresist applied by a spin coating process, pre-baked, exposed to light projected through a photomask, baked after exposure, and developed with a chemical developer to define the sections on the dielectric layer 21.

Figure 3:
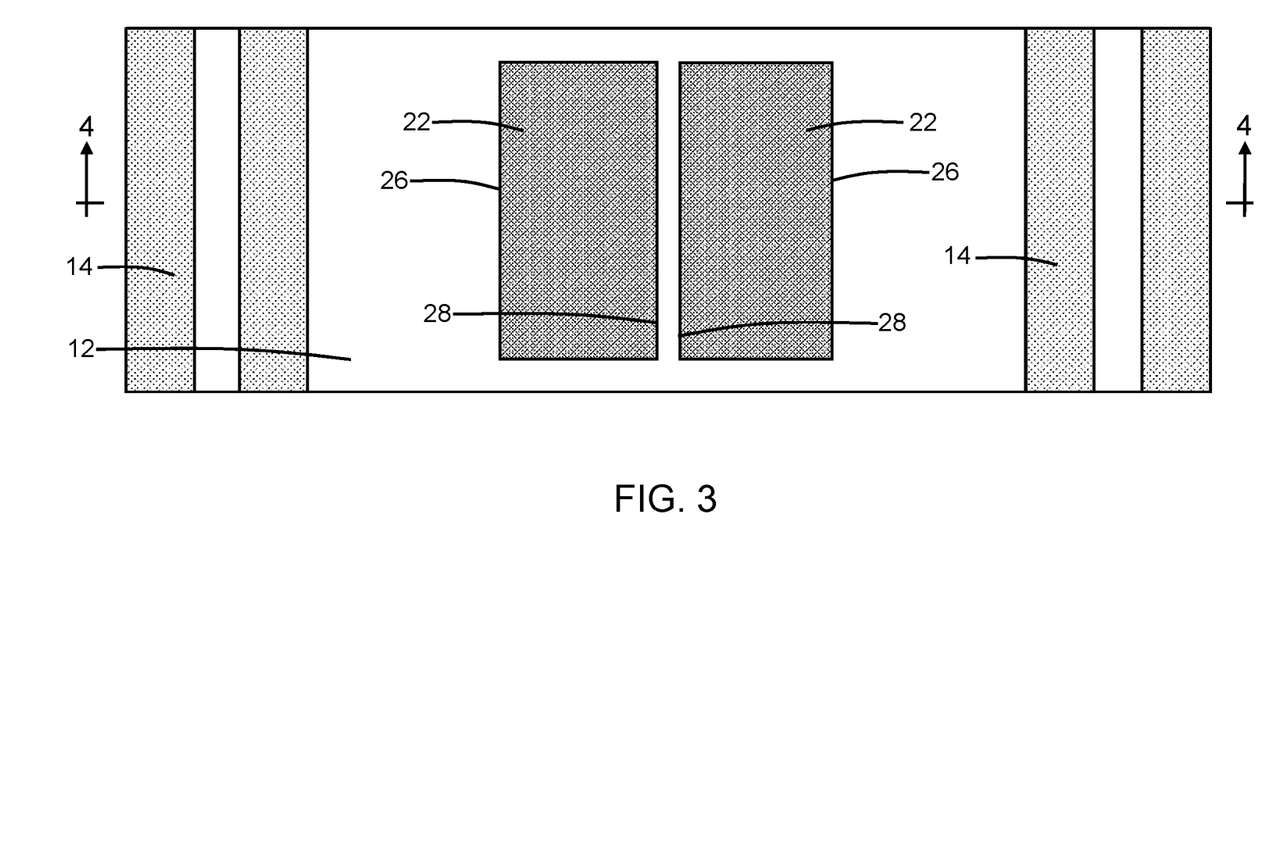
FIG. 3 is a top view of the structure at a fabrication stage subsequent to FIG. 1.
Figure 4:
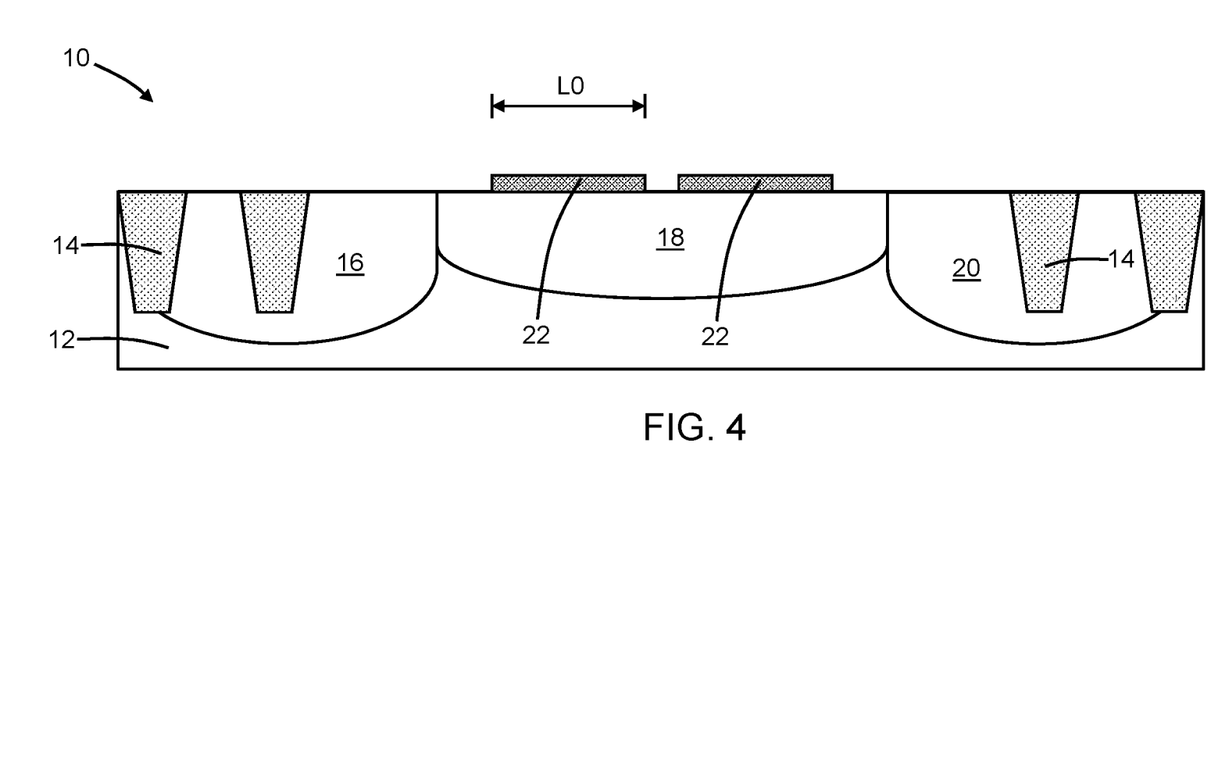
FIG. 4 is a cross-sectional view taken generally along line 4-4 in FIG. 3.

With reference to FIGS. 3, 4 in which like reference numerals refer to like features in FIGS. 1, 2 and at a subsequent fabrication stage, the dielectric layer 21 is patterned by an etching process with the etch mask 24 present. In an embodiment, the etching process may be a reactive ion etching process. Sections of the dielectric layer 21 beneath the shapes of the etch mask 24 are protected during the reactive ion etching process and define a pair of buffer dielectric layers 22. The etch mask 24 is stripped following the conclusion of the etching process. The buffer dielectric layers 22 are located in an overlapping relationship with the well 16, and may have a symmetrical arrangement over the well 18. In an embodiment, the buffer dielectric layers 22 may fully overlap with the well 18.

Each buffer dielectric layer 22 has a sidewall 26 and a sidewall 28 that is opposite to, and laterally spaced from, the sidewall 26. The sidewalls 28 of each buffer dielectric layer 22 are positioned adjacent to each other and are separated by a gap that is subsequently used to form a drain region in the well 18. Each buffer dielectric layer 22 has a length dimension equal to a length L0 between the sidewall 26 and the sidewall 28. In an embodiment, each buffer dielectric layer 22 may be a rectangular block. Each buffer dielectric layer 22 is positioned on a drain side of the structure 10 and may function to reduce the drain side capacitance.

Figure 5:
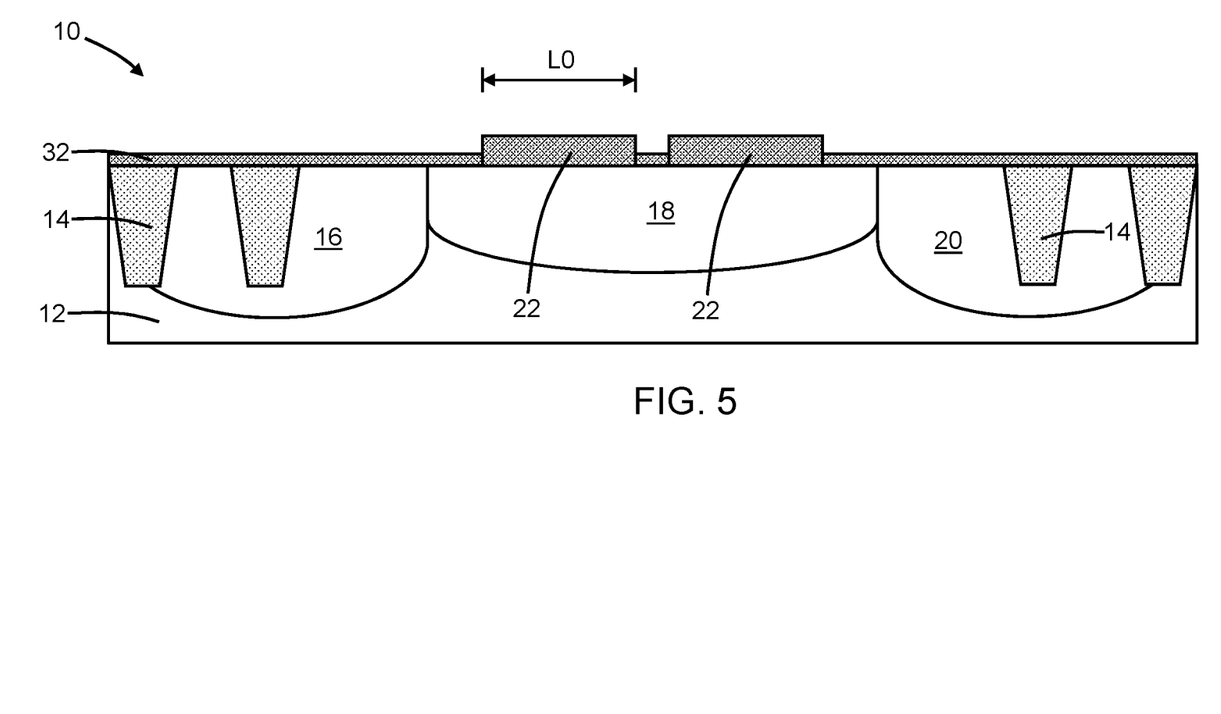
FIG. 5 is a cross-sectional view of the structure at a fabrication stage subsequent to FIG. 4.

With reference to FIG. 5 in which like reference numerals refer to like features in FIGS. 3, 4 and at a subsequent fabrication stage, a gate dielectric layer 32 is formed on the substrate 12. The gate dielectric layer 32 is comprised of a dielectric material, such as silicon dioxide. In an embodiment, the gate dielectric layer 32 may be formed by thermal oxidation of the semiconductor material of the substrate 12. The buffer dielectric layers 22 may be thickened by the thermal oxidation process forming the gate dielectric layer 32.

Figure 6:
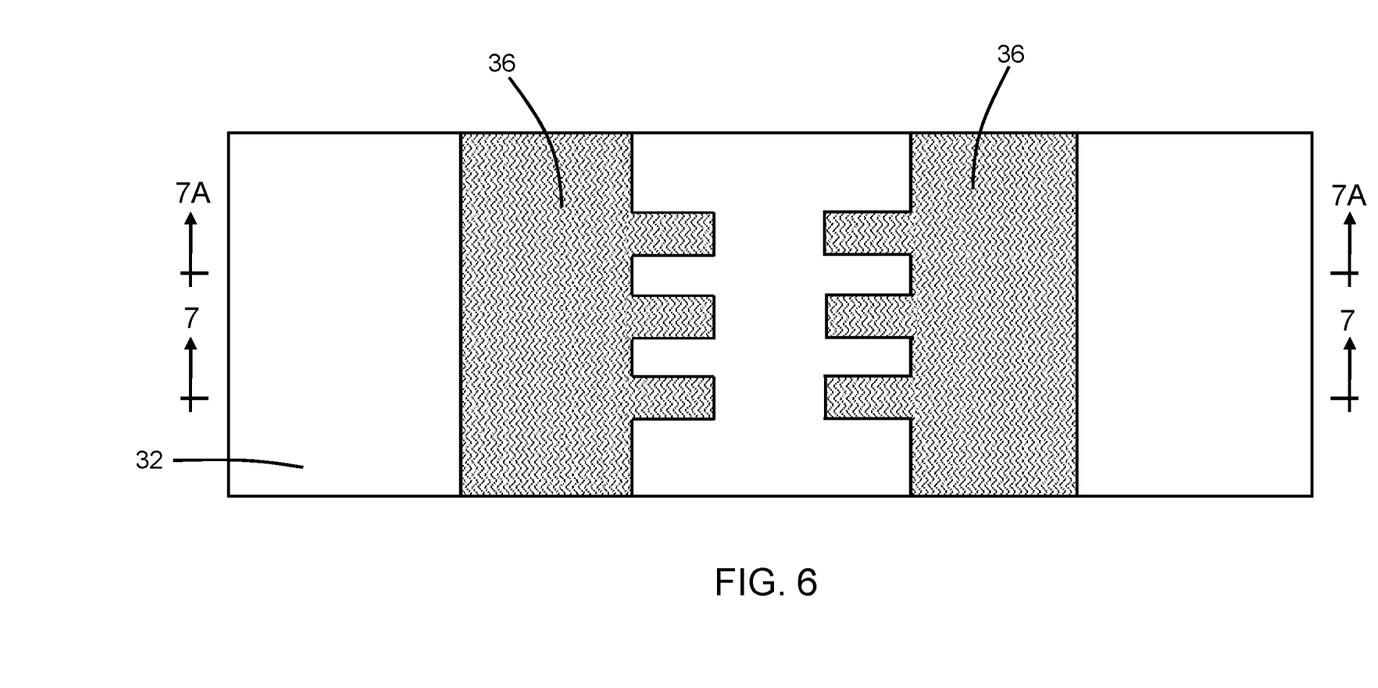
FIG. 6 is a top view of the structure at a fabrication stage subsequent to FIG. 5.
Figure 7:
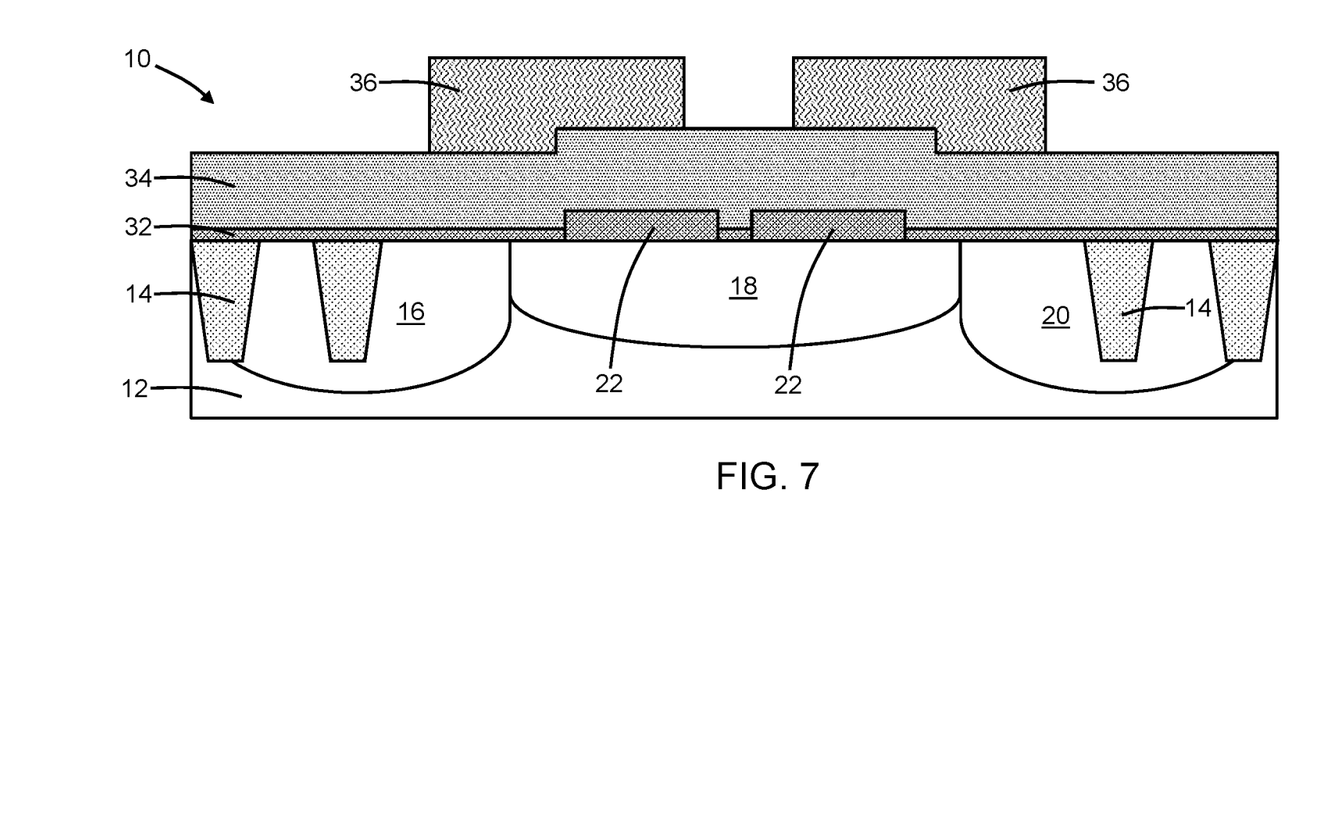
FIG. 7 is a cross-sectional view taken generally along line 7-7 in FIG. 6.
Figure 7A:
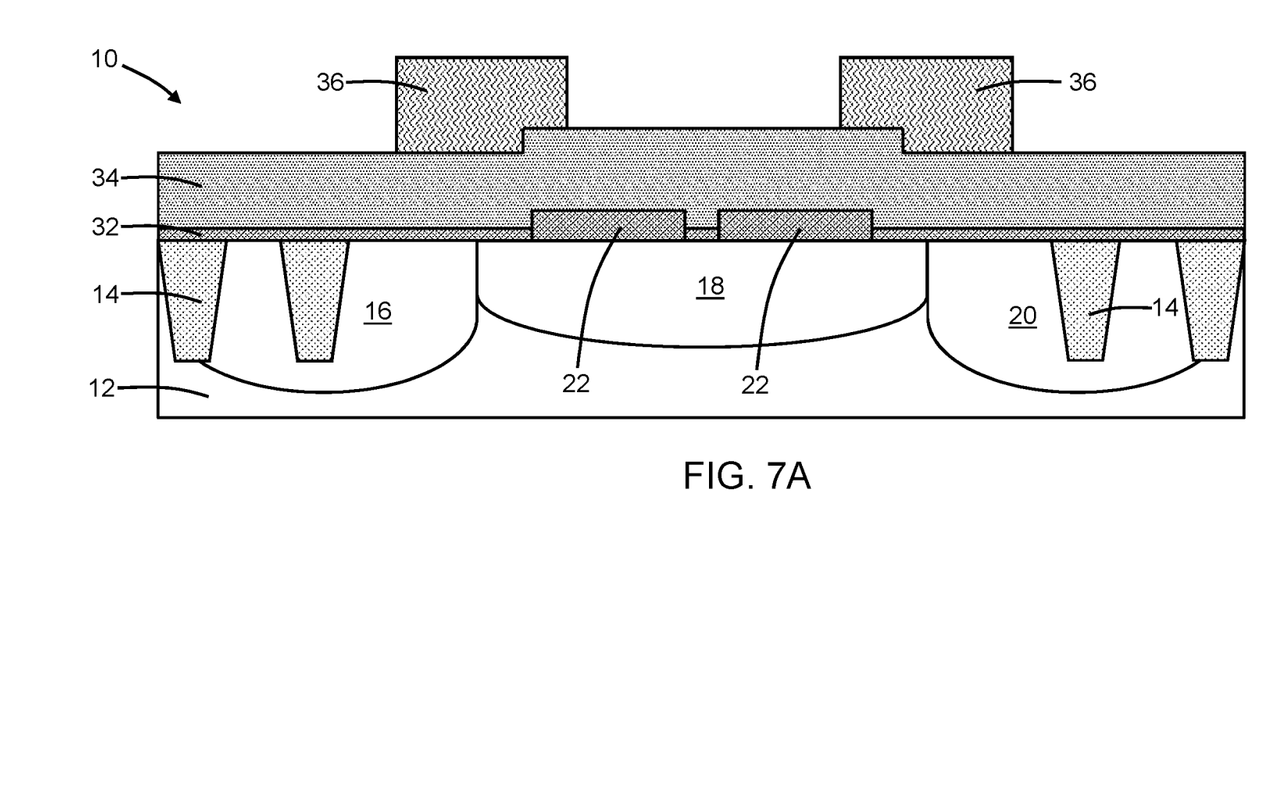
FIG. 7A is a cross-sectional view taken generally along line 7A-7A in FIG. 6.

With reference to FIGS. 6, 7, 7A in which like reference numerals refer to like features in FIG. 5 and at a subsequent fabrication stage, a layer 34 comprised of a conductor, such as doped polysilicon, is deposited. An etch mask 36 may be formed by a lithography process on the layer 34. The etch mask 36 may comprise an organic photoresist applied by a spin coating process, pre-baked, exposed to light projected through a photomask, baked after exposure, and developed with a chemical developer to define shapes at the intended locations on the layer 34. Each shape of the etch mask 36 includes a notched side edge that is positioned over the buffer dielectric layer 22.

Figure 8:
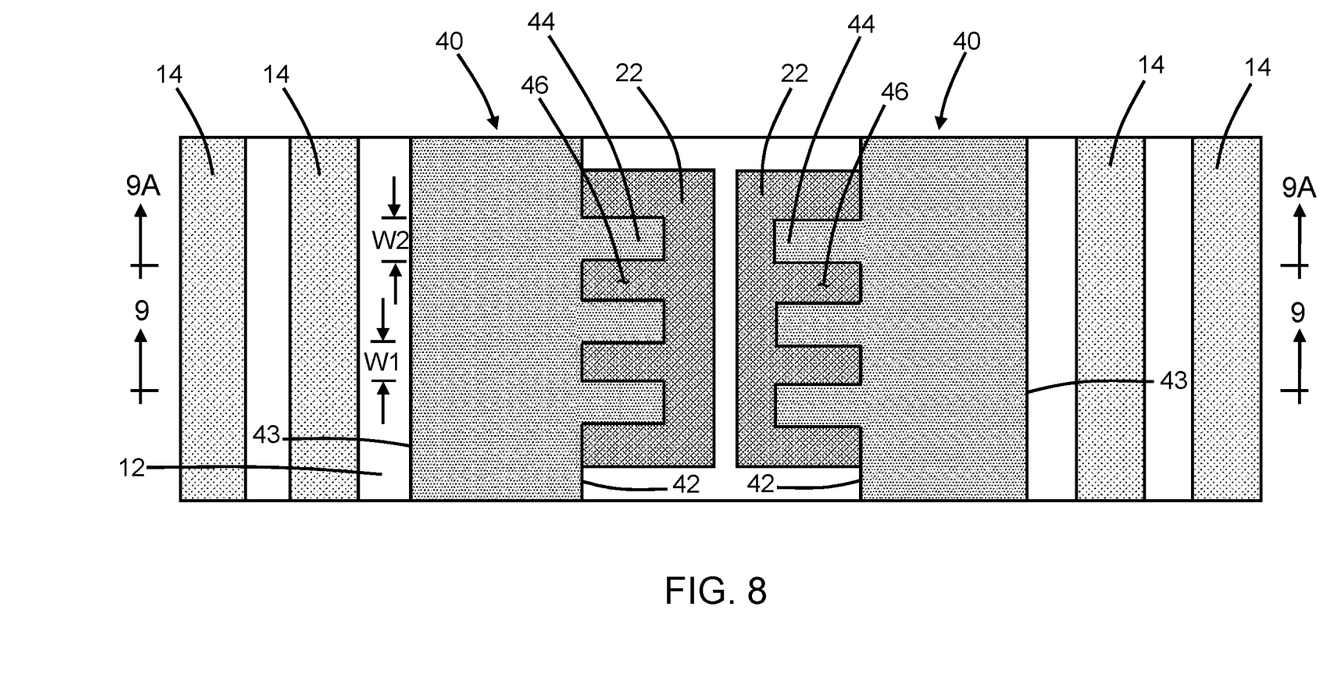
FIG. 8 is a top view of the structure at a fabrication stage subsequent to FIG. 6.
Figure 9:
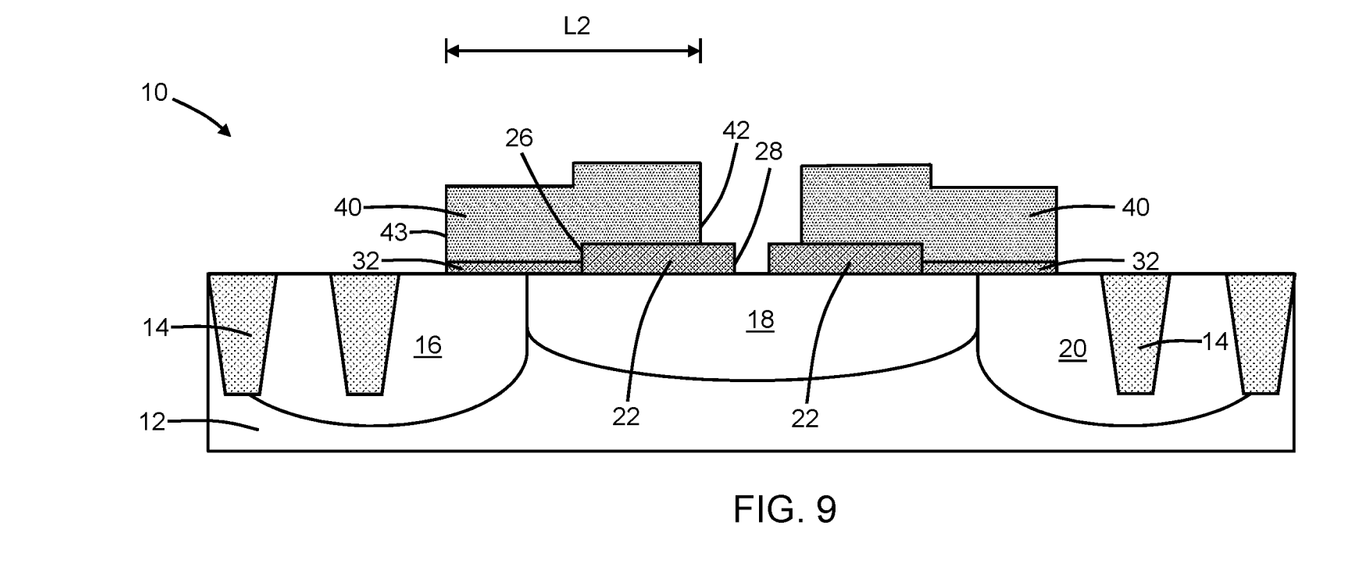
FIG. 9 is a cross-sectional view taken generally along line 9-9 in FIG. 8.
Figure 9A:
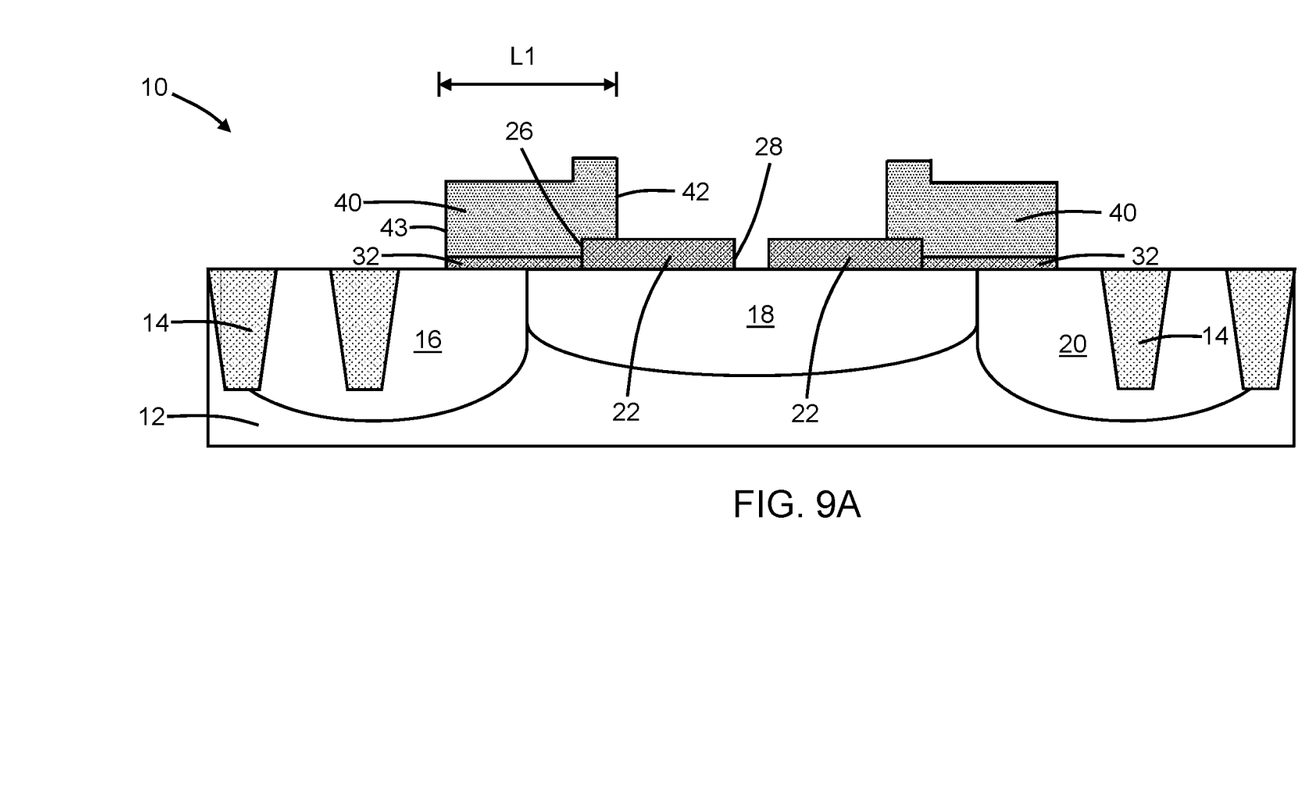
FIG. 9A is a cross-sectional view taken generally along line 9A-9A in FIG. 8.
Figure 10:
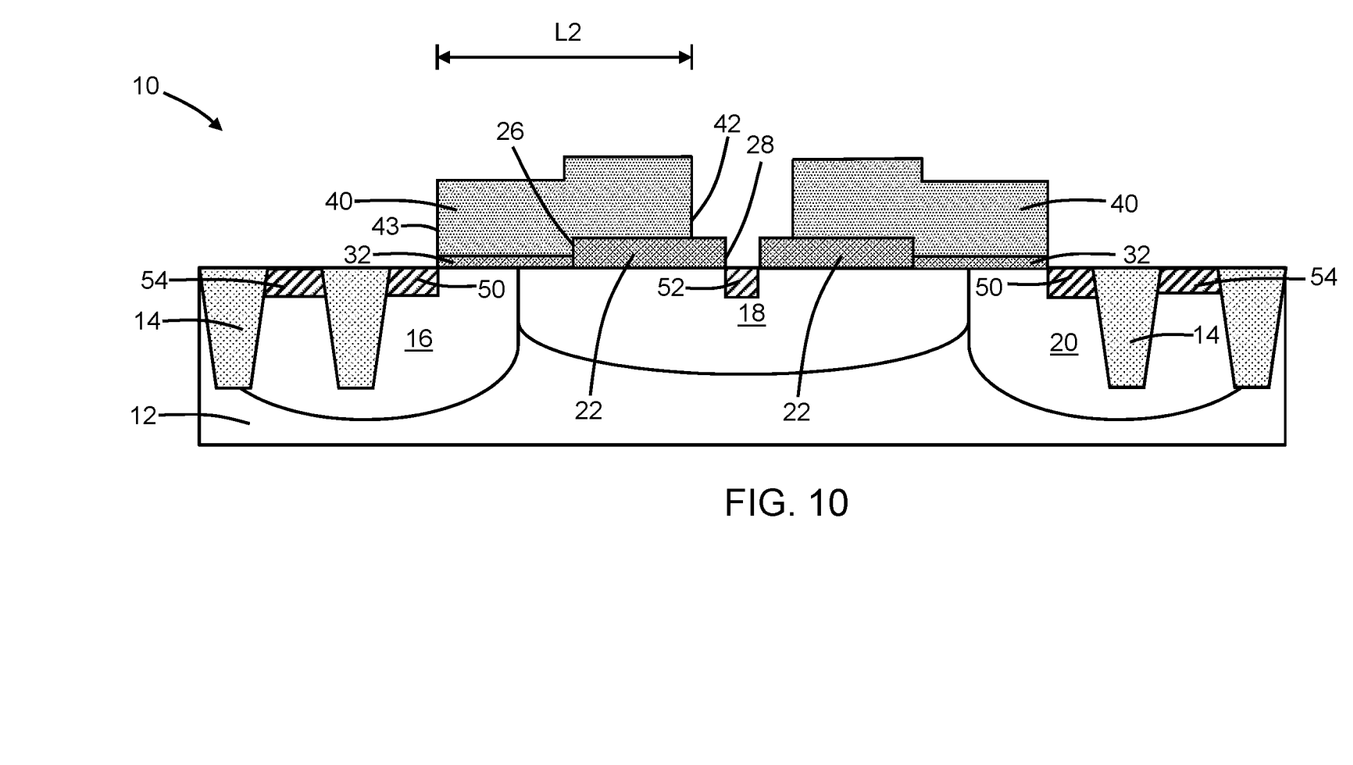
FIGS. 10, 10A are cross-sectional views of the structure at a fabrication stage subsequent to FIGS. 9, 9A.
Figure 10A:
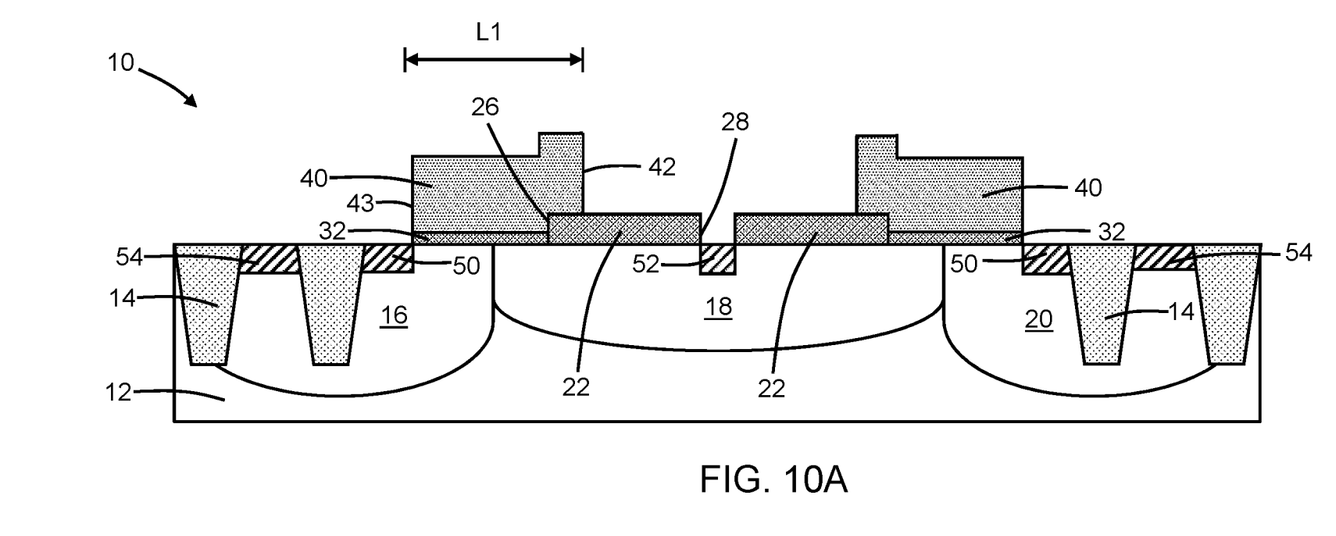

With reference to FIGS. 8, 9, 9A in which like reference numerals refer to like features in FIGS. 6, 7, 7A and at a subsequent fabrication stage, gate electrodes 40 are formed by patterning the layer 34 with lithography and etching processes. The gate dielectric layer 32 is also patterned and, although not shown, the buffer dielectric layers 22 may be slightly thinned when the gate dielectric layer 32 is patterned. Each gate electrode 40 includes a portion that overlaps with one of the buffer dielectric layers 22, and each gate electrode 40 includes a different portion that overlaps with the patterned gate dielectric layer 32. Each gate electrode 40 has a notched sidewall 42 and a sidewall 43 that is opposite from the notched sidewall 42. The notched sidewalls 42 of the different gate electrodes 40 are located adjacent to each other and are separated by a non-uniform gap that is positioned over the well 18.

Each gate electrode 40 has a length dimension between the sidewalls 42, 43 that varies with position along the notched sidewall 42. In particular, each gate electrode 40 varies between a length dimension equal to a length L1 and a length dimension equal to a length L2 that is greater than the length L1. The portions of each gate electrode 40 with the length dimension equal to the length L2 define fingers 44, and the fingers 44 of the different gate electrodes 40 project laterally toward each other. Notches 46 are defined as respective spaces that are indented between adjacent pairs of fingers 44. The notches 46 have a lateral dimension relative to the ends of the fingers 44 equal to the difference between the length L1 and the length L2. In an embodiment, the notches 46 may extend fully through the thickness of the gate electrode 40. In an embodiment, the fingers 44 and notches 46 alternate with position along the notched sidewall 42 of each gate electrode 40 such that each notch 46 is positioned along the notched sidewall 42 of each gate electrode 40 between an adjacent pair of the fingers 44.

Each finger 44 has a width W1, and each notch 46 has a width W2 that may be different from the width W1. In an embodiment, the width W2 of each notch 46 may be greater than the width W1 of each finger 44, which may lead to a reduction in the on-resistance. In an embodiment, the width W2 of each notch 46 may be less than the width W1 of each finger 44, which may lead to a reduction in the gate charge.

The fingers 44 and notches 46, which collectively define the notched sidewall 42 of each gate electrode 40, are located over one of the buffer dielectric layers 22, and the fingers 44 overlap with the respective buffer dielectric layer 22. The fingers 44 and notches 46 of each gate electrode 40 are positioned between the sidewall 26 and the sidewall 28 of one of the buffer dielectric layers 22. The fingers 44 and notches 46 of each gate electrode 40 are fully positioned between the sidewall 26 and the sidewall 28 of one of the buffer dielectric layers 22. The fingers 44 of each gate electrode 40 cover portions the buffer dielectric layer 22, and the notches 46 of each gate electrode 40 expose portions of the buffer dielectric layer 22 that are positioned along the notched sidewall 42 between the covered portions. A dielectric sidewall spacer (not shown) may be formed that extends about the periphery of each gate electrode 40. The fingers 44 and notches 46 of each gate electrode 40 are not located over the trench isolation regions 14, but are instead located interior of the trench isolation regions 14 over the buffer dielectric layer 22 and the well 18.

With reference to FIG. 9 in which like reference numerals refer to like features in FIG. 8 and at a subsequent fabrication stage of the processing method, a doped region 50, doped regions 52, and doped regions 54 are formed in the wells 16, 18, 20. The doped regions 50, 52 may have a conductivity type of a polarity opposite to the conductivity type of the doped region 54. In an embodiment in which the well 18 has p-type conductivity, the well 16 has n-type conductivity, and the well 20 has n-type conductivity, the doped regions 50, 52 may be doped (e.g., heavily doped) with an n-type dopant (e.g., phosphorus and/or arsenic) to provide n-type conductivity, and the doped regions 54 may be doped (e.g., heavily doped) with a p-type dopant (e.g., boron) to provide p-type conductivity. The doped regions 50, 52 may be formed by implanting ions, such as ions including the n-type dopant, with an implantation mask defining the intended locations for the doped regions 50, 52 in the substrate 12. The doped regions 54 may be formed by implanting ions, such as ions including the p-type dopant, with a different implantation mask defining the intended locations for the doped regions 54 in the substrate 12.

The doped regions 50 may provide source regions for the extended-drain metal-oxide-semiconductor device, the doped region 52 may provide a drain region for the extended-drain metal-oxide-semiconductor device, and the doped regions 54 may provide body contacts. The doped region 50, which is coupled to the well 16, may be doped to have an opposite conductivity type from the well 16. The doped region 52, which is coupled to the well 18, may be doped to have the same conductivity type as the well 18 but at a higher dopant concentration. The doped region 50, which is coupled to the well 20, may be doped to have an opposite conductivity type from the well 20. The doped region 54, which is coupled to the well 16, may be doped to have the same conductivity type as the well 16 but at a higher dopant concentration.

The doped region 54, which is coupled to the well 20, may be doped to have the same conductivity type as the well 20 but at a higher dopant concentration.

Each pairing of buffer dielectric layer 22 and gate electrode 40 is laterally positioned on the substrate 12 between the doped region 52 and one of the doped regions 50. The fingers 44 and notches 46 in each gate electrode 40 are adjacent to the doped region 52. The dielectric material beneath each gate electrode 40 is a composite of the dielectric material of the buffer dielectric layer 22 and the dielectric material of the gate dielectric layer 32. The patterned gate dielectric layer 32 associated with each gate electrode 40 is positioned on the substrate 12 between one of the buffer dielectric layers 22 and one of the doped regions 50.

Middle-of-line (MOL) processing and back-end-of-line (BEOL) processing follow, which includes formation of an interconnect structure coupled with the structure 10. In particular, one or more contacts are formed that are coupled with each gate electrode 40, one or more contacts are formed that are coupled with each doped region 50, one or more contacts are formed that are coupled with the doped region 52, and one or more contacts are formed that are coupled with each doped region 54.

The lengths L1, L2 of each gate electrode 40 may be used to adjust the gate charge, the drain-source on-resistance, the figure of merit, and/or the breakdown voltage of the extended-drain metal-oxide-semiconductor device. The widths of the fingers 44 and notches 46, as well as the number of fingers 44, may also be used to adjust the extent of the overlap of each patterned gate electrode 40 with its buffer dielectric layer 22. For example, decreasing the width of the fingers 44 decreases the extent of the overlap by each gate electrode 40 with its buffer dielectric layer 22 and may reduce the on-resistance. As another example, increasing the width of the fingers 44 increases the extent of the overlap by each gate electrode 40 with its buffer dielectric layer 22 and may reduce the gate charge.

Figure 11:
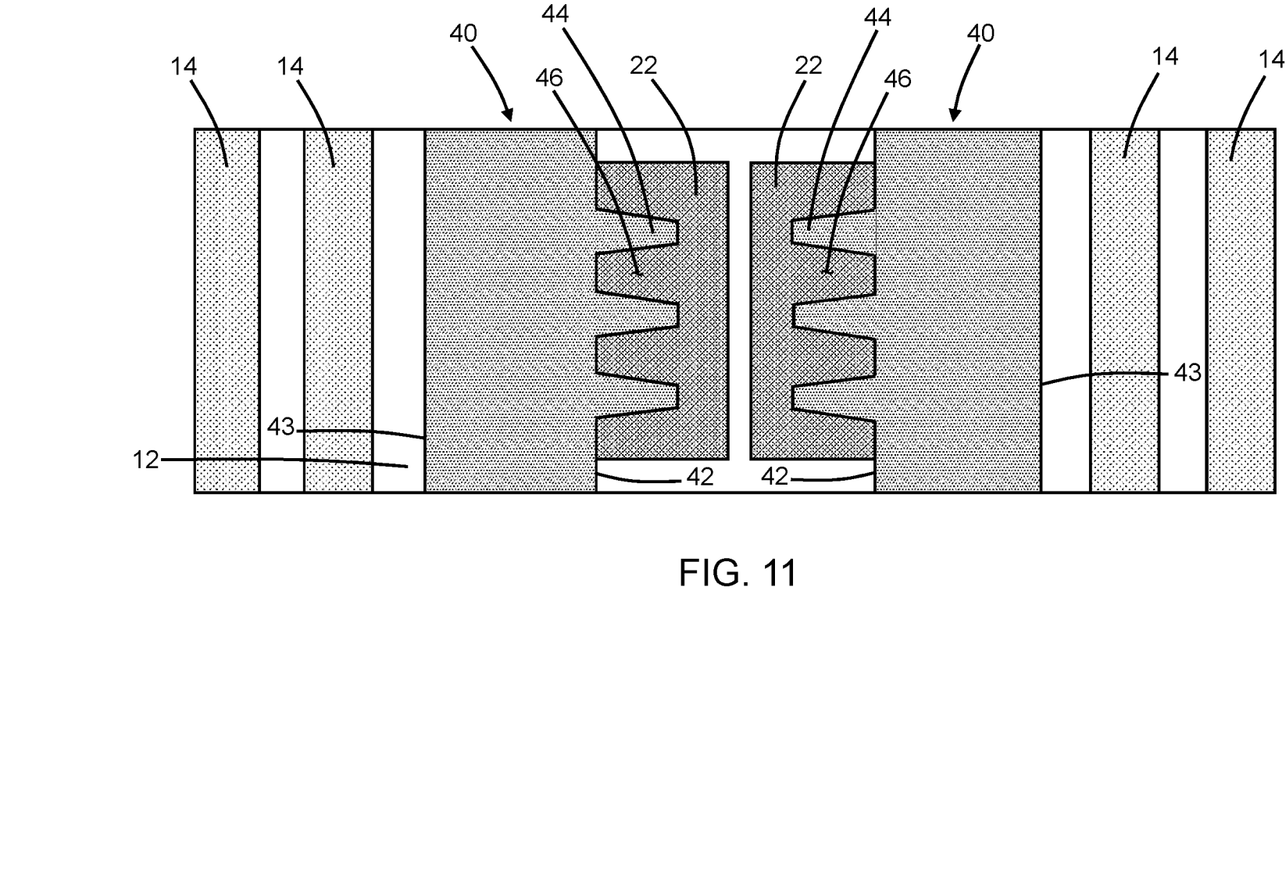
FIG. 11 is a top view of a structure in accordance with alternative embodiments of the invention.

With reference to FIG. 11 in which like reference numerals refer to like features in FIG. 8 and in accordance with alternative embodiments of the invention, the fingers 44 of each gate electrode 40 may have a different shape, such as a trapezoidal shape, instead of a rectangular shape. The notches 46 between the fingers 44 may have a complementary shape (e.g., trapezoidal shape) that is inversely related in the width dimension to the width dimension of the fingers 44. The shapes of the fingers 44 and notches 46 may be adjusted to optimize both the on-resistance and the gate charge for tailoring the performance of the extended-drain metal-oxide-semiconductor device.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present. Different features may "overlap" if a feature extends over, and covers a part of, another feature.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure for an extended-drain metal-oxide-semiconductor device, the structure comprising:
    a substrate having a top surface and a first well;
    a source region in the substrate;
    a drain region in the first well;
    a buffer dielectric layer that is positioned on the top surface of the substrate adjacent to the drain region and that fully overlaps the first well; and
    a gate electrode laterally positioned between the source region and the drain region, the gate electrode including a first portion that overlaps with the buffer dielectric layer, and the first portion of the gate electrode including a plurality of fingers arranged over the buffer dielectric layer and a plurality of notches arranged fully over the buffer dielectric layer.

2. The structure of claim 1 further comprising:
    a second well in the substrate adjacent to the first well, wherein the source region is positioned in the second well, and the gate electrode includes a second portion positioned over the second well.

3. The structure of claim 1 wherein the notches and the fingers are positioned adjacent to the drain region.

4. The structure of claim 1 wherein the gate electrode has a first sidewall adjacent to the drain region, the plurality of fingers are disposed along the first sidewall, and the notches and the fingers alternate along the first sidewall.

5. The structure of claim 4 wherein the gate electrode has a second sidewall adjacent to the source region, the second sidewall is spaced from the first sidewall at a location of each finger by a first length dimension, the second sidewall is spaced from the first sidewall at a location of each notch by a second length dimension, and the first length dimension is greater than the second length dimension.

6. The structure of claim 4 wherein the gate electrode has a second sidewall adjacent to the source region, and the gate electrode is unnotched along the second sidewall.

7. The structure of claim 1 wherein each finger has a first width, and each notch has a second width that is greater than the first width.

8. The structure of claim 1 wherein each finger has a first width, and each notch has a second width that is less than the first width.

9. The structure of claim 1 wherein each notch has a trapezoidal shape, and each finger has a trapezoidal shape.

10. The structure of claim 1 further comprising:
    a gate dielectric layer positioned on the substrate between the buffer dielectric layer and the source region,
    wherein the gate electrode has a second portion that overlaps with the gate dielectric layer.

11. The structure of claim 10 wherein the buffer dielectric layer is thicker than the gate dielectric layer.

12. The structure of claim 1 wherein the gate electrode has a first sidewall adjacent to the drain region and a second sidewall adjacent to the source region, the buffer dielectric layer includes a first portion laterally positioned between the first sidewall of the gate electrode and the drain region, and the buffer dielectric layer includes a second portion laterally positioned between the second sidewall of the gate electrode and the source region.

13. The structure of claim 1 wherein the buffer dielectric layer has a first sidewall adjacent to the drain region and a second sidewall opposite from the first sidewall, and the notches in the first portion of the gate electrode are positioned between the first sidewall and the second sidewall of the buffer dielectric layer.

14. The structure of claim 13 wherein the notches in the first portion of the gate electrode are fully positioned between the first sidewall and the second sidewall of the buffer dielectric layer.

15. A method of forming a structure for an extended-drain metal-oxide-semiconductor device, the method comprising: forming a source region in a substrate; forming a well in the substrate; forming a drain region in the well; forming a buffer dielectric layer that is positioned on a top surface of the substrate adjacent to the drain region and that fully overlaps the well; and forming a gate electrode laterally positioned between the source region and the drain region, wherein the gate electrode includes a first portion that overlaps with the buffer dielectric layer, and the first portion of the gate electrode includes a plurality of fingers arranged over the buffer dielectric layer and a plurality of notches arranged fully over the buffer dielectric layer.

16. The method of claim 15 wherein the notches and the fingers are positioned adjacent to the drain region.

17. The method of claim 15 wherein the gate electrode has a first sidewall adjacent to the drain region, the plurality of fingers are disposed along the first sidewall, and each notch is positioned along the first sidewall between an adjacent pair of the fingers.

18. The method of claim 15 further comprising:
    forming a gate dielectric layer positioned on the substrate between the buffer dielectric layer and the source region,
    wherein the gate electrode has a second portion that overlaps with the gate dielectric layer, and the buffer dielectric layer is thicker than the gate dielectric layer.

19. The method of claim 15 wherein the buffer dielectric layer has a first sidewall adjacent to the drain region and a second sidewall opposite from the first sidewall, and the notches in the first portion of the gate electrode are positioned between the first sidewall and the second sidewall of the buffer dielectric layer.

20. The structure of claim 4 wherein the notches and the fingers are positioned adjacent to the drain region.

* * * * *